United States Patent
Huang

(10) Patent No.: US 10,319,498 B2
(45) Date of Patent: Jun. 11, 2019

(54) FLEXIBLE FLAT CABLE

(71) Applicant: Shenzhen China Star Optoelectronics Technology Co., Ltd., Shenzhen, Guangdong (CN)

(72) Inventor: Xiaoyu Huang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 145 days.

(21) Appl. No.: 15/301,331

(22) PCT Filed: Jul. 20, 2016

(86) PCT No.: PCT/CN2016/090615
§ 371 (c)(1),
(2) Date: Sep. 30, 2016

(87) PCT Pub. No.: WO2017/210965
PCT Pub. Date: Dec. 14, 2017

(65) Prior Publication Data
US 2018/0151270 A1 May 31, 2018

(30) Foreign Application Priority Data
Jun. 8, 2016 (CN) .......................... 2016 1 0405878

(51) Int. Cl.
*H01B 7/08* (2006.01)
*H01B 7/04* (2006.01)
(Continued)

(52) U.S. Cl.
CPC .............. *H01B 7/0823* (2013.01); *H01B 7/04* (2013.01); *H01R 12/613* (2013.01); *H01R 12/62* (2013.01);
(Continued)

(58) Field of Classification Search
CPC ...... H01B 7/0823; H01B 7/04; H01B 7/0846; H01R 12/62; H01R 12/613; H01R 12/61;
(Continued)

(56) References Cited

U.S. PATENT DOCUMENTS 5,219,282 A * 6/1993 Lavin ..................... A61C 7/146
433/2
8,018,737 B2 * 9/2011 Fujiwara ................ H05K 3/361
174/254
(Continued)

FOREIGN PATENT DOCUMENTS

CN H01319273 A 12/1989
CN 1316799 A 10/2001
(Continued)

*Primary Examiner* — Steven T Sawyer
*Assistant Examiner* — Paresh H Paghadal
(74) *Attorney, Agent, or Firm* — Andrew C. Cheng

(57) ABSTRACT

The present invention provides a flexible flat cable. The flexible flat cable including: a first flexible flat cable and a second flexible flat cable, wherein: an end of the first flexible flat cable is connected with a first terminal; an another end of the first flexible flat cable is provided with a plurality of first pads; an end of the second flexible flat cable is connected with a second terminal; an another end of the second flexible flat cable is provided with a plurality of second pads connected with the plurality of first pads in one-to-one correspondence. The flexible flat cable according to the exemplary embodiments of the present invention can improve versatility, reusability and repairability of the flexible flat cable.

8 Claims, 3 Drawing Sheets

(51) Int. Cl.
- *H01R 12/61* (2011.01)
- *H01R 12/62* (2011.01)
- *H05K 1/11* (2006.01)
- *H05K 1/14* (2006.01)
- *H01R 12/77* (2011.01)
- *H01R 12/75* (2011.01)
- *H01R 12/72* (2011.01)
- *H01R 12/73* (2011.01)
- *H01R 12/79* (2011.01)
- *H01R 12/70* (2011.01)
- *H01R 12/71* (2011.01)
- *H01R 12/78* (2011.01)
- *H01R 4/04* (2006.01)

(52) U.S. Cl.
CPC .............. *H01B 7/0846* (2013.01); *H01R 4/04* (2013.01); *H01R 12/61* (2013.01); *H01R 12/7076* (2013.01); *H01R 12/718* (2013.01); *H01R 12/72* (2013.01); *H01R 12/721* (2013.01); *H01R 12/728* (2013.01); *H01R 12/73* (2013.01); *H01R 12/732* (2013.01); *H01R 12/75* (2013.01); *H01R 12/77* (2013.01); *H01R 12/78* (2013.01); *H01R 12/79* (2013.01); *H05K 1/117* (2013.01); *H05K 1/142* (2013.01); *H05K 2201/0919* (2013.01); *H05K 2201/09172* (2013.01); *H05K 2201/09472* (2013.01); *H05K 2201/10356* (2013.01)

(58) Field of Classification Search
CPC .............. H01R 12/7076; H01R 12/714; H01R 12/718; H01R 12/72; H01R 12/721; H01R 12/728; H01R 12/73; H01R 12/732; H01R 12/75; H01R 12/77; H01R 12/78; H01R 12/79; H05K 2201/10356; H05K 1/117; H05K 1/142; H05K 2201/0919; H05K 2201/09172; H05K 2201/09472; H05K 2201/06709; H05K 2201/09845

See application file for complete search history.

(56) References Cited

U.S. PATENT DOCUMENTS

| | | | |
|---|---|---|---|
| 8,314,338 B2* | 11/2012 | Ishii ....................... | H05K 1/142 174/255 |
| 9,095,069 B2* | 7/2015 | Stefanoff ............... | H05K 1/142 |
| 9,601,884 B2* | 3/2017 | Komoto ................ | H01R 24/60 |
| 9,633,976 B1* | 4/2017 | Bernstein ............ | H01L 25/0655 |
| 9,966,697 B2* | 5/2018 | Lu .......................... | H01R 13/20 |
| 2007/0155194 A1* | 7/2007 | Vega Martinez ...... | H05K 1/142 439/62 |
| 2013/0017692 A1* | 1/2013 | Que ..................... | H01R 12/732 439/65 |
| 2014/0011390 A1* | 1/2014 | Hasegawa .............. | H01R 12/62 439/371 |

FOREIGN PATENT DOCUMENTS

| | | |
|---|---|---|
| CN | 103514996 A | 1/2014 |
| CN | 103534879 A | 1/2014 |

\* cited by examiner

FLEXIBLE FLAT CABLE

TECHNICAL FIELD

The present invention relates to the technical field of data transmission cable, and more particularly, to a flexible flat cable.

BACKGROUND ART

The FFC (Flexible Flat Cable) is widely applied to connections between various hardware devices, between a mobile device and a main board, and between printed circuit boards (PCB) due to its advantages in the freedom in choosing numbers of wires and spacings there-between, the easy-to-connect features and the low cost, in order to perform transmissions of various types of data and signals.

A TFT-LCD (Thin Film Transistor Liquid Crystal Display) is currently one of the main products for flat panel display, and has become an important display platform in modern information technology (IT) and video solutions. A process of driving the TFT-LCD is mainly as follows: an R/G/B compression signal, a control signal and electric power are transmitted from a system main board to a C-Board (Control Board), and are processed by using a TCON (Timing Controller) chip on the C-Board, and are transmitted through the FFC to a PCB1 and a PCB2 for further processing, and are then transmitted to a display region through an S-COF (Source-Chip on Film) and a G-COF (Gate-Chip on Film), so as to allow the LCD to obtain the required power and various signals. In the process of driving the TFT-LCD, the FFC can be utilized in transmissions of the power and the various signals to meet the requirements of thinning tendency, high reliability and easy connection.

FIG. 1 shows the structure of a traditional FFC. The traditional FFC includes a substrate, and a terminal 1 and a terminal 2 on both ends of the substrate. The non-conducting substrate includes a plurality of conductive metal wires. Pins of both ends of the conductive metal wire are connected accordingly with the terminal 1 and the terminal 2. The terminal 1 and the terminal 2 are connected with two connectors respectively in order to achieve transmissions of signals and data between hardware (e.g. two PCBs) to which the two connectors are connected.

Wherein the shapes of the terminal 1 and the terminal 2 must match with the structures of the corresponding connectors, and if either one of the terminal 1 and the terminal 2 mismatches with the structure of the corresponding connector, the entire FFC should be replaced. On the other hand, an external force or great force is often required to connect the terminal to the connector, wherein the mechanisms are connected through engaging, and if the above procedures are repeated for some times, the terminals may quickly wear out, and will be easily damaged. Even if only one terminal is damaged, the entire FFC should be replaced, hence causing a waste of the FFC.

SUMMARY

To solve the above defects in using the traditional flexible flat cable, the present invention provides a flexible flat cable including: a first flexible flat cable and a second flexible flat cable, wherein an end of the first flexible flat cable is connected with a first terminal; an another end of the first flexible flat cable is provided with a plurality of first pads; an end of the second flexible flat cable is connected with a second terminal; an another end of the second flexible flat cable is provided with a plurality of second pads connected with the plurality of first pads in one-to-one correspondence.

The first flexible flat cable can include a first portion for arranging a first type of pads among the plurality of first pads, the second flexible flat cable can include a second portion for arranging a second type of pads among the plurality of second pads, and a shape of the first portion is complementary with a shape of the second portion.

The another end of the first flexible flat cable and the another end of the second flexible flat cable are both in sawtooth shape, and a shape of the another end of the first flexible flat cable is complementary with a shape of the another end of the second flexible flat cable; the first portion is a protruding portion of sawtooth shape, and the second portion is a recessed portion of sawtooth shape.

The first flexible flat cable can include a third portion for arranging a second type of pads among the plurality of first pads, the second flexible flat cable can include a fourth portion for arranging a first type of pads among the plurality of second pads, and a shape of the third portion is complementary with a shape of the fourth portion.

The another end of the first flexible flat cable and the another end of the second flexible flat cable are both in sawtooth shapes, and a shape of the another end of the first flexible flat cable is complementary with a shape of the another end of the second flexible flat cable; the third portion is a recessed portion of sawtooth shape, and the fourth portion is a protruding portion of sawtooth shape.

The first type of pads can be pads arranged on a back side of the flexible flat cable, and the second type of pads can be pads arranged on a front side of the flexible flat cable.

The first flexible flat cable can include a plurality of first wires, each of the plurality of first wires connected to one of the plurality of first pads; the second flexible flat cable can include a plurality of second wires, each of the plurality of second wires connected to one of the plurality of second pads.

The connections between the plurality of first pads and the plurality of second pads are a detachable connection. Alternately, the plurality of first pads and the plurality of second pads can be connected through a conductive adhesive.

According to the exemplary embodiment of the present invention, one only need to replace the first flexible flat cable and/or the second flexible flat cable adaptively based on a structure of the connector and a damage situation of the terminal, rather than replacing the entire flexible flat cable, so that the versatility, reusability and repairability of the flexible flat cable can be improved.

BRIEF DESCRIPTION OF THE DRAWINGS

The above and other features and advantages of exemplary embodiments will become apparent through the detailed description of the exemplary embodiments with reference to the accompanying drawings. The same reference numbers represent the same structures and elements throughout the figures and the drawings may not be illustrated to scale, wherein.

DETAILED DESCRIPTION OF EXEMPLARY EMBODIMENTS

Here the detailed exemplary embodiments of the inventive concept are disclosed. However, in order to describe purposes of the exemplary embodiments, only representative details of the specific structure and function are disclosed hereby. However, the exemplary embodiments can be realized in many alternative ways, and should not be construed as being limited to these exemplary embodiments described herein.

Figure 1:
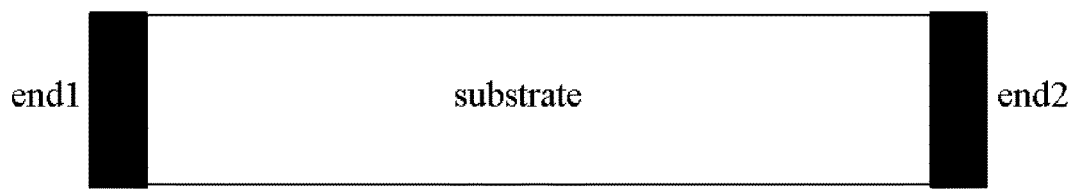
FIG. 1 illustrates a structure diagram of a traditional FFC.

With respect to the defect in using the traditional FFC structure as mentioned in FIG. 1, the present invention involves an FFC which can improve versatility and reusability of the FFC.

Figure 2:
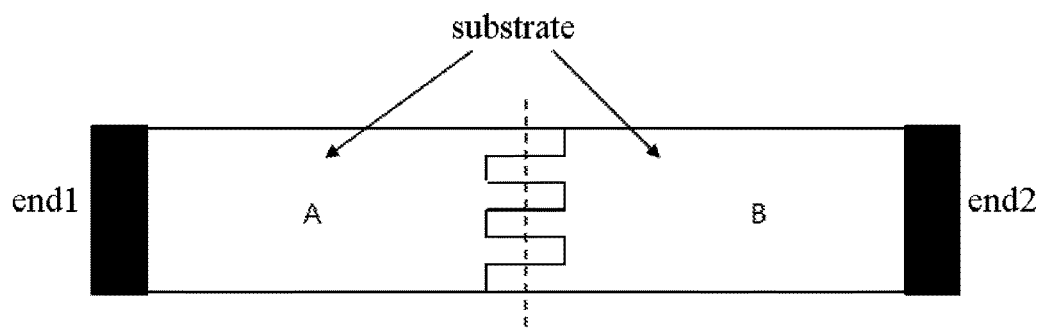
FIG. 2 illustrates an overall view of the FFC structure according to the embodiment.

FIG. 2 illustrates an overall view of the FFC structure of the present invention. As shown in FIG. 2, the FFC of the present invention includes a first flexible flat cable (hereinafter referred to as the A portion) and a second flexible flat cable (hereinafter referred to as the B portion). One end of the A portion is connected with a first terminal, and the other end is provided with a plurality of first pads. One end of the B portion is connected with a second terminal, and the other end is provided with a plurality of second pads connected with the plurality of first pads in one-to-one correspondence. Next, the A and B portions will be described in details with reference to FIGS. 3A to 4B.

Figure 3A:
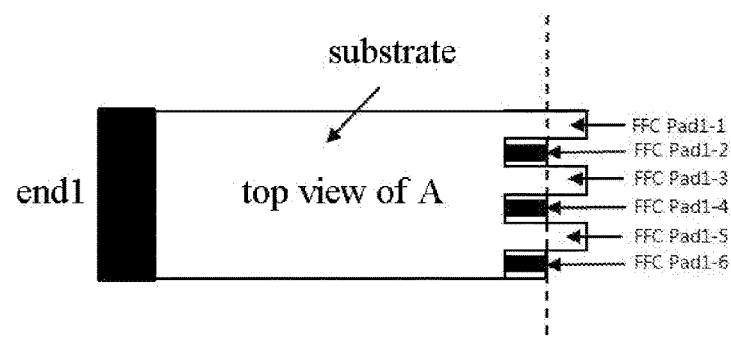
FIG. 3A illustrates a top view of an A portion of the FFC structure according to the embodiment.
Figure 4A:
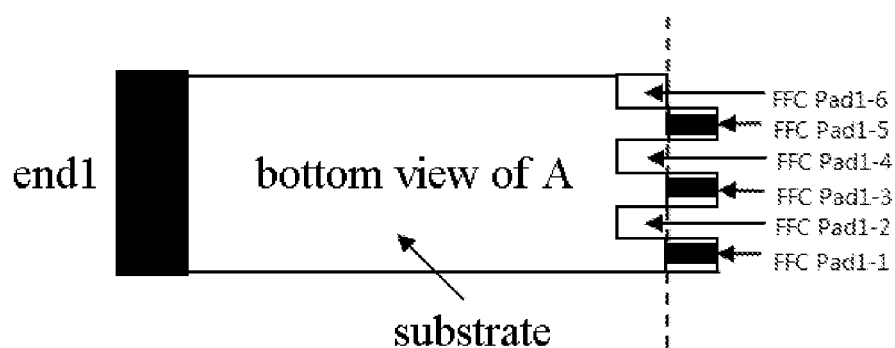
FIG. 4A illustrates a bottom view of an A portion of the FFC structure according to the embodiment.

FIGS. 3A and 4A illustrate respectively top view and bottom view of the A portion of the FFC structure of the present invention. Referring to FIGS. 3A and 4A, the A portion of the FFC is constructed to have a sawtooth shape, and the protruding portion and recessed portion of sawtooth shape are provided with the first pads respectively. In the A portion, the protruding portion of sawtooth shape can be called the first portion, and the recessed portion of sawtooth shape can be called the third portion. The respective first pads can be conductive slices connected with the conductive metal wires inside the substrate.

If an FFC of 6 Pin (i.e. a number of Pin of the FFC is 6) is taken for example, the A portion of the FFC includes 6 first pads: FFC Pad1-1 to FFC Pad1-6. In the present embodiment, the FFC Pad1-1 can be located at a back side of the first portion (protruding portion of sawtooth shape), the FFC Pad1-2 can be located at a front side of the third portion (recessed portion of sawtooth shape), and FFC Pad1-3 to FFC Pad1-6 are provided alternately as above.

Figure 3B:
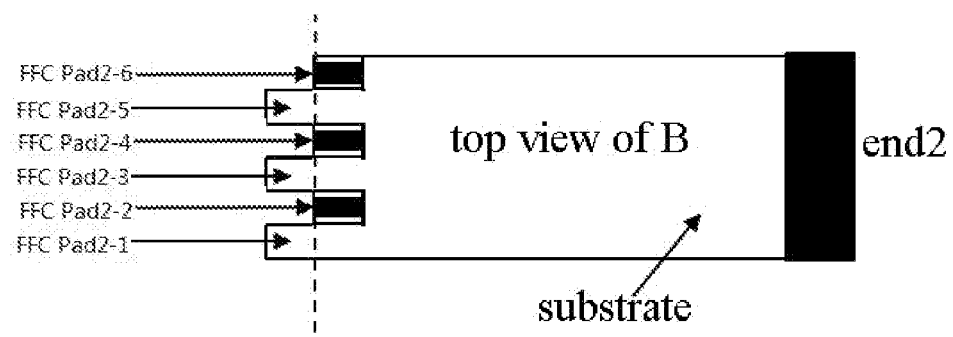
FIG. 3B illustrates a top view of a B portion of the FFC structure according to the embodiment.
Figure 4B:
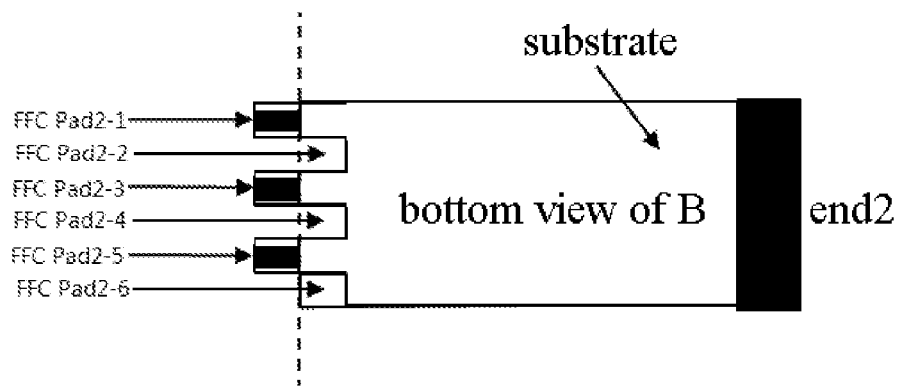
FIG. 4B illustrates a bottom view of a B portion of the FFC structure according to the embodiment.

FIGS. 3B and 4B illustrate respectively top view and bottom view of the B portion complementary to the A portion of the FFC as mentioned above. Referring to FIGS. 3B and 4B, the B portion is constructed to have a sawtooth shape complementary to the A portion, and the complementary protruding portion and recessed portion of sawtooth shape are provided with the second pads respectively. In the B portion, the recessed portion of sawtooth shape can be called the second portion, and the protruding portion of sawtooth shape can be called the fourth portion. Corresponding to the A portion, the B portion includes 6 second pads. As shown in FIG. 2, when the FFC Pad1-1 of the A portion is located at the back side of the first portion (protruding portion of sawtooth shape), the FFC Pad2-6 in the 6 second pads of the B portion is provided at the front side of the second portion (recessed portion of sawtooth shape), so that the FFC Pad 2-6 of the B portion and the FFC Pad1-1 of the A portion can be effectively connected. As shown in FIG. 2, when the FFC Pad1-2 of the A portion can be located at the front side of the third portion (recessed portion of sawtooth shape), the FFC Pad2-5 of the B portion is provided at the back side of the fourth portion (protruding portion of sawtooth shape), so that the FFC Pad 2-5 of the B portion and the FFC Pad1-2 of the A portion can be effectively connected. In this way, the FFC Pad1-3 to FFC Pad 1-6 of the A portion and the FFC Pad2-4 to FFC Pad2-1 of the B portion are connected respectively in sequence.

In addition, for succinct description, the pads arranged on the back side of the A portion or B portion of the FFC can also be called the first type of pads, and the pads arranged on the front side of the A portion or B portion of the FFC can also be called the second type of pads. Here, the terms "front side" and "back side" only indicate two different sides of the FFC. The terms "first", "second", "third" and "fourth" are only used for distinguishing different portions.

In accordance with an exemplary embodiment, the first type of pads arranged on the first portion and the second type of pads arranged on the second portion can be connected in one-to-one correspondence, the second type of pads arranged on the third portion and the first type of pads arranged on the fourth portion can be connected in one-to-one correspondence. The above connections in one-to-one correspondence can be detachable conductive connections, and after being connected, the pads are insulated to the outside, for example, the corresponding two pads can be connected by using conductive adhesive.

Figure 5:
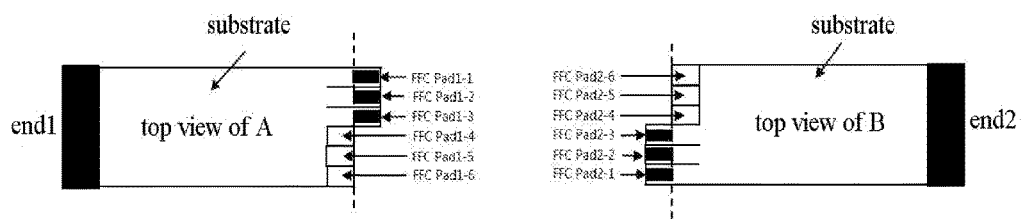
FIG. 5 illustrates a top view of the A portion and the B portion of the FFC structure according to another embodiment.
Figure 6:
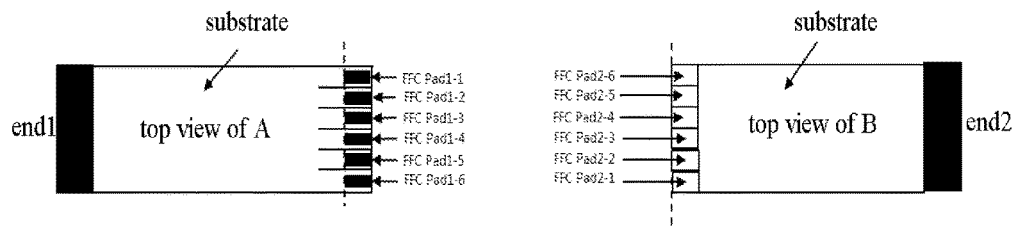
FIG. 6 illustrates a top view of the A portion and the B portion of the FFC structure according to another embodiment.

FIG. 5 and FIG. 6 show the exemplary embodiments of the A portion and B portion constructed to have complementary shapes.

As shown in FIG. 5, the structure of the A portion is a protruding sawtooth shape and a recessed sawtooth shape, and the structure of the B portion is constructed correspondingly to be complementary to the structure of the A portion. Wherein a number of protrusions and a number of recesses in the A portion can be configured randomly, and a sum of said two numbers equals to a number of Pins of the FFC.

FIG. 6 shows that the A portion of the FFC is entirely constructed as a protruding structure, and the B portion is entirely constructed as a corresponding recessed structure.

The above examples show that the A portion and the B portion are designed to have sawtooth shape in order to be connected. However, the concept of the present invention is not limited to thereto, and in accordance with an exemplary embodiment of the present invention, the A portion and B portion can be designed into various structures which are randomly complementary and can be easily detached and connected, for example, the A portion and B portion can be the complementary pin structures. Such complementary structures as in the exemplary embodiment can prevent interruption of information transmission caused by breaking of the A portion and B portion during usage. The detachable connection can improve versatility, reusability and repairability of the FFC. For example, when using the FFC, if a terminal 1 in FIG. 3 is damaged, rather than replacing the entire FFC, only a new A portion should be adopted as replacement; if the terminal of one end of the FFC does not match with a connector structure of the existing product, a portion therein should be replaced, rather than redesigning the entire FFC.

The exemplary embodiments have been described as above, while the exemplary embodiment of the present invention is not limited thereto. Obviously the exemplary embodiments can be changed and realized in many alternative ways. Such change is not deemed as deviating from the spirit and scope of intentions of the exemplary embodiments, which is obvious to those skilled in the art that the amendment in its entirety intents to be contained in the the following claims.

The invention claimed is:

1. A flexible flat cable including: a first flexible flat cable and a second flexible flat cable, wherein:
   an end of the first flexible flat cable is connected with a first terminal;
   an another end of the first flexible flat cable is provided with a plurality of first pads;
   an end of the second flexible flat cable is connected with a second terminal;
   an another end of the second flexible flat cable is provided with a plurality of second pads connected with the plurality of first pads in one-to-one correspondence;
   wherein the first flexible flat cable has a front side and a back side and the plurality of first pads are alternatively arranged on the front side and the back side of the first flexible cable; and
   wherein the second flexible flat cable has a front side and a back side and the plurality of second pads are alternatively arranged on the front side and the back side of the second flexible cable, the first pads and the second pads being connected with each other by having the first and second pads overlapping each other in a thickness direction defined between the front side and back side of the first flexible flat cable or the front side and the back side of the second flexible flat cable;
   wherein the first flexible flat cable includes a plurality of first portions for arranging a first type of pads among the plurality of first pads on the back side of the first flexible flat cable, and wherein the second flexible flat cable includes a plurality of second portions for arranging a second type of pads among the plurality of second pads on the front side of the second flexible flat cable, and a shape of the plurality of first portions is complementary with a shape of the plurality of first portions;
   wherein the another end of the first flexible flat cable and the another end of the second flexible flat cable are both in a sawtooth shape, and a shape of the another end of the first flexible flat cable is complementary with a shape of the another end of the second flexible flat cable; each of the plurality of first portions is a protruding portion of a plurality of protruding portions of the sawtooth shape of the first flexible flat cable, and each of the plurality of second portions is a recessed portion of a plurality of second portions of the sawtooth shape of the second flexible flat cable.

2. The flexible flat cable of claim 1, wherein the first flexible flat cable includes a plurality of third portions for arranging a second type of pads among the plurality of first pads on the front side of the first flexible flat cable, and wherein the second flexible flat cable includes a plurality of fourth portions for arranging a first type of pads among the plurality of second pads on the back side of the second flexible flat cable, and a shape of the plurality of third portions is complementary with a shape of the plurality of fourth portions.

3. The flexible flat cable of claim 1, wherein the first flexible flat cable includes a plurality of third portions for arranging the second type of pads among the plurality of first pads on the front side of the first flexible flat cable, and wherein the second flexible flat cable includes a plurality of fourth portions for arranging the first type of pads among the plurality of second pads on the back side of the second flexible flat cable, and a shape of the plurality of third portions is complementary with a shape of plurality of fourth portions.

4. The flexible flat cable of claim 2, wherein the another end of the first flexible flat cable and the another end of the second flexible flat cable are both in a sawtooth shape, and a shape of the another end of the first flexible flat cable is complementary with a shape of the another end of the second flexible flat cable; each of the plurality of third portions is a recessed portion of a plurality of recessed portions of the sawtooth shape of the first flexible flat cable, and each of the plurality of fourth portions is a protruding portion of a plurality of protruding portions of the sawtooth shape of the second flexible flat cable.

5. The flexible flat cable of claim 3, wherein the another end of the first flexible flat cable and the another end of the second flexible flat cable are both in a sawtooth shape, and a shape of the another end of the first flexible flat cable is complementary with a shape of the another end of the second flexible flat cable; each of the plurality of third portions is a recessed portion of a plurality of recessed portions of the sawtooth shape of the first flexible flat cable, and each of the plurality of fourth portions is a protruding portion of a plurality of protruding portions of the sawtooth shape of the second flexible flat cable.

6. The flexible flat cable of claim 1, wherein the first flexible flat cable includes a plurality of first wires, each of the plurality of first wires connected to one of the plurality of first pads; the second flexible flat cable includes a plurality of second wires, each of the plurality of second wires connected to one of the plurality of second pads.

7. The flexible flat cable of claim 1, wherein connections between the plurality of first pads and the plurality of second pads are detachable connections.

8. The flexible flat cable of claim 1, wherein the plurality of first pads and the plurality of second pads are connected through a conductive adhesive.

* * * * *